(12) United States Patent
Corisis et al.

(10) Patent No.: US 7,071,542 B2
(45) Date of Patent: **\*Jul. 4, 2006**

(54) LEAD FRAME DECOUPLING CAPACITOR, SEMICONDUCTOR DEVICE PACKAGES INCLUDING THE SAME AND METHODS

(75) Inventors: David J. Corisis, Meridian, ID (US); Chris G. Martin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 346 days.

This patent is subject to a terminal disclaimer.

(21) Appl. No.: 10/269,191

(22) Filed: Oct. 11, 2002

(65) Prior Publication Data

US 2003/0052402 A1 Mar. 20, 2003

Related U.S. Application Data

(63) Continuation of application No. 09/009,668, filed on Jan. 20, 1998, now Pat. No. 6,515,359.

(51) Int. Cl.
*H01L 23/495* (2006.01)

(52) U.S. Cl. .................................. 257/676; 257/728
(58) Field of Classification Search ................ 257/676
See application file for complete search history.

(56) References Cited

U.S. PATENT DOCUMENTS

| | | | |
|---|---|---|---|
| 4,410,905 A | 10/1983 | Grabbe | |
| 4,680,613 A | 7/1987 | Daniels et al. | |
| 4,891,687 A | 1/1990 | Mallik et al. | |
| 4,965,654 A | 10/1990 | Karner et al. | |

(Continued)

FOREIGN PATENT DOCUMENTS

| | | |
|---|---|---|
| DE | 3626151 | 2/1988 |
| JP | 6393139 | 4/1988 |
| JP | 3165549 | 7/1991 |
| JP | 3276747 | 12/1991 |
| JP | 4162657 | 6/1992 |
| JP | 4188759 | 7/1992 |
| JP | 6045504 | 2/1994 |

*Primary Examiner*—Douglas A. Wille
(74) *Attorney, Agent, or Firm*—TraskBritt, PC

(57) ABSTRACT

A lead frame includes at least two layers, each of which includes an electrically conductive bus and a group of leads that extend substantially unidirectionally from a single edge of the lead frame. The lead fingers of each layer may extend in substantially the same direction. The electrically conductive buses of the two or more lead frame layers are at least partially superimposed with respect to one another. An insulator element is disposed between at least portions of the superimposed regions of the buses. One of the buses is connectable to a power supply source ($V_{CC}$), while the other is connectable to a power supply ground ($V_{SS}$). Thus, the mutually superimposed regions of the buses form a decoupling capacitor. Lead fingers of one of the layers may be arranged in groups which flank the remainder of the lead fingers so that they are not interleaved therewith.

22 Claims, 7 Drawing Sheets

U.S. PATENT DOCUMENTS

| | | |
|---|---|---|
| 4,969,032 A | 11/1990 | Scheitlin et al. |
| 4,984,059 A | 1/1991 | Kubota et al. |
| 4,994,936 A | 2/1991 | Hernandez |
| 5,032,895 A | 7/1991 | Horiuchi et al. |
| 5,095,402 A | 3/1992 | Hernandez et al. |
| 5,103,283 A | 4/1992 | Hite |
| 5,105,257 A | 4/1992 | Michii |
| 5,132,773 A | 7/1992 | Braden et al. |
| 5,140,496 A | 8/1992 | Heinks et al. |
| 5,200,364 A | 4/1993 | Loh |
| 5,200,809 A | 4/1993 | Kwon |
| 5,212,402 A | 5/1993 | Higgins, III |
| 5,214,845 A | 6/1993 | King et al. |
| 5,229,639 A | 7/1993 | Hansen et al. |
| 5,235,209 A | 8/1993 | Shimizu et al. |
| 5,237,202 A | 8/1993 | Shimizu et al. |
| 5,281,556 A | 1/1994 | Shimizu et al. |
| 5,291,060 A | 3/1994 | Shimizu et al. |
| 5,311,056 A | 5/1994 | Wakabayashi et al. |
| 5,311,057 A | 5/1994 | McShane |
| 5,365,106 A | 11/1994 | Watanabe |
| 5,446,317 A * | 8/1995 | Sato et al. ............... 257/734 |
| 5,457,340 A | 10/1995 | Templeton, Jr. et al. |
| 5,534,729 A | 7/1996 | Russell |
| 5,543,660 A | 8/1996 | Dombroski |
| 5,559,306 A | 9/1996 | Mahulikar |
| 5,665,473 A | 9/1997 | Okoshi et al. |
| 5,734,198 A * | 3/1998 | Stave .................... 257/666 |
| 5,859,477 A | 1/1999 | Fehr |
| 5,867,367 A | 2/1999 | Barrow |
| 5,932,923 A | 8/1999 | Kim et al. |
| 6,054,754 A | 4/2000 | Bissey |

* cited by examiner

LEAD FRAME DECOUPLING CAPACITOR, SEMICONDUCTOR DEVICE PACKAGES INCLUDING THE SAME AND METHODS

CROSS-REFERENCE TO RELATED APPLICATION

This application is a continuation of application Ser. No. 09/009,668, filed Jan. 20, 1998 now U.S. Pat. No 6,515,359, issued Feb. 4, 2003.

BACKGROUND OF THE INVENTION

1. Field of the Invention

The present invention relates to semiconductor device assemblies employing multi-layered lead frames and, more specifically, to semiconductor device assemblies disposing a decoupling capacitor in a close, substantially co-extensive relationship with a semiconductor device bearing an integrated circuit.

2. Background of Related Art

There is a continued trend in the computer industry toward ever-higher speed integrated circuit (IC) assemblies based upon semiconductor device technology. Such high signal speeds, however, lack utility unless accompanied by suppression of system noise to an acceptable level. The trend toward lower operational signal voltages in combination with such high speeds exacerbates noise problems.

At state-of-the art operational speeds, signal propagation delays, switching noise, and crosstalk between signal conductors resulting from mutual inductance and self inductance phenomena of the conductive paths all become significant to signal degradation. Mutual inductance results from an interaction between magnetic fields created by signal currents flowing to and from a lead frame-mounted, packaged semiconductor device through the leads or "lead fingers," while self inductance results from the interaction of the foregoing fields with magnetic fields created by oppositely-directed currents flowing to and from ground.

Therefore, the integrated circuits carried on a semiconductor device would ideally be electrically connected to conductive traces on carrier substrates such as printed circuit boards and thus to other semiconductor devices carried on the same or other such substrates by infinitesimally short conductors, eliminating impedance problems such as undesirable inductance and other conductor-induced system noise.

As a practical matter, however, as the capacity and speed of many semiconductor devices such as dynamic random access memories (DRAMs) has increased, the number of inputs and outputs (I/Os) to each semiconductor device has increased, requiring more numerous and complex external connections thereto, and in some instances requiring undesirably long lead frame lead fingers to place the inner lead ends in contact with, or in close proximity to, the bond pads serving as I/Os for the typical semiconductor device.

While lead inductance in IC packages has not traditionally been troublesome because slow signal frequencies of past devices render such inductance relatively insignificant, faster and ever-increasing signal frequencies of state-of-the-art electronic systems have substantially increased the practical significance of lead inductance. For example, at such faster signal frequencies, performance of integrated circuit dice using lead frames for external electrical connection is slower than desirable because the inductance associated with the lead fingers slows changes in signal currents through the leads, prolonging signal propagation through the leads.

Further, digital signals propagating along the lead fingers are dispersing or "spreading out" because the so-called "Fourier" components of various frequencies making up the digital signals propagate through the inductance associated with the lead fingers at different speeds, causing the signal components and thus the signals themselves to disperse along the lead fingers. While mild dispersion merely widens the digital signals without detrimental effect, severe dispersion can make the digital signals unrecognizable upon receipt. In addition, so-called "reflection" signals propagating along the lead fingers as a result of impedance mismatches between the lead fingers and associated semiconductor device or between the lead fingers and external circuitry, caused in part by lead-associated inductance, can distort normal signals propagating along the lead fingers concurrently with the reflection signals. Further, magnetic fields created by signal currents propagating through the lead-associated inductance can induce currents in adjacent lead fingers, causing so-called "crosstalk" noise on the latter. While these various effects might be troublesome in any electronic system, the aforementioned trend toward lower voltage systems (currently 3.3 volts) and away from the traditional 5.0 volt systems increases their visibility and significance.

Certain currently-popular semiconductor device and package configurations serve to exacerbate the noise problems by favoring a large plurality of laterally adjacent lead fingers of substantial length. For example, so-called lead-over-chip (LOC) configurations typically place the bond pads of a semiconductor device in one or two rows extending along the longitudinal axis of the semiconductor device. To accommodate the centralized bond pad location for wire-bonding and at the same time eliminate the need for a conventional die-attach paddle as a physical semiconductor device support, LOC lead frames have been developed which employ lead fingers extending from the sides of the semiconductor device and over the active surface into close proximity with the bond pad row or rows. The semiconductor device is then supported from the undersides of the extending lead fingers, typically through an intervening polyimide film such as a Kapton™ tape having an adhesive coating on its upper and lower surfaces, the film serving as a dielectric, an alpha barrier and a protective coating for the active surface.

While a mechanically desirable packaging concept, the LOG-type long, mutually parallel lead fingers running over the active surface become abusive in terms of unacceptably increasing real impedance as well as lead inductance (both self and mutual) in the circuit. These lead finger runs also increase signal reflection in the circuit due to transmission line effects and degrade signal integrity due to the aforementioned propagation delays, switching noise, and crosstalk. Further, elimination of the die-attach paddle also eliminates the potential for employing a ground plane under the semiconductor device without additional processing steps, and such a ground plane in any case would not alleviate the problems attendant to use of the long lead fingers extending over the semiconductor device's active surface.

LOC configurations are merely one example of the type of packaging promoting the above-referenced undesirable noise phenomena. However, the same undesirable characteristics may be experienced with other lead frame configurations employing extended lead fingers, particularly large groups of such lead fingers in close mutual proximity. Such configurations include lead-under-chip (LUC) configurations, and configurations wherein a large number of leads extend from several sides of a semiconductor device to a single side or edge of a package, such as in a vertical surface mount package, or VSMP.

Packages have previously been configured in an attempt to reduce package noise of the type described above. For example, U.S. Pat. No. 5,214,845, assigned to the assignee of the present invention, employs a flexible, laminated sandwich assembly of an outer ground plane and an outer power plane dielectrically isolated from a series of conductive traces running therebetween. The traces and planes are connected to corresponding bond pads on the semiconductor device at one end, and to lead fingers on the other, as by thermocompression bonding (in the case of a TAB embodiment) or by wire bonds. Such an arrangement obviously doubles the number of required I/O connections, necessitating additional fabrication time and increasing the possibility of a faulty connection. Further, the flexible sandwich assembly constitutes an additional element of the package, increasing material cost.

Another approach to the problem is disclosed in U.S. Pat. No. 5,559,306, wherein metal plates are employed above and below leads extending to the exterior of plastic and ceramic packages to effect reduction of self and mutual inductance. However, such configurations as disclosed appear to require relatively complex fabrication techniques to locate and fix the plates relative to the semiconductor device and lead fingers or other conductors for subsequent transfer molding of a filled-polymer package thereabout, while the ceramic package embodiment is not cost-effective for high-volume, commercial packaging.

Accordingly, the inventors have recognized the need for a low-cost, reduced-inductance circuit configuration adaptable to current packaging designs and employing conventional and readily-available materials, equipment and fabrication techniques.

SUMMARY OF THE INVENTION

A semiconductor device package according to the present invention includes a substrate and a semiconductor device disposed upon the substrate.

A multi-layer lead frame of the leads-over-chip (LOC) type, leads-under-chip (LUC) type, or other type of lead frame arrangement provides an electrically conductive passageway from the semiconductor device disposed upon the substrate to devices that are external of the assembly. The multiple layers of the lead frame are joined by an interposed dielectric layer, which is also referred to as an insulator element, and each include a wide, electrically conductive bus. The layers may form a "paddle" or "support platform" to which a semiconductor device is secured. The bus of one of the lead frame layers is a power supply bus, while the bus of the other lead frame layer is a ground bus. The buses of each layer at least partially overlap to form a decoupling capacitor over a portion of the semiconductor device.

One of the lead frame layers includes a wide bus having one or more ground ($V_{SS}$) lead fingers electrically connected thereto. Another of the lead frame layers includes a wide bus having one or more power ($V_{CC}$) lead fingers electrically connected thereto.

The decoupling capacitor reduces coupling and suppresses noise that is typically produced by the power supply components. Moreover, the juxtaposition and placement of the power supply lead fingers adjacent the sides of the semiconductor device package and away from (i.e., not interleaved with) the remaining lead fingers reduces the troublesome characteristics of mutual inductance and self inductance. Further, the placement of the buses in positions that would otherwise be occupied by long, adjacent, bent lead fingers also eliminates the magnetic fields that are typically generated by such lead fingers.

The multi-layer lead frame of the present invention also imparts at least a nominal heat sink effect to the semiconductor device, promoting the more even distribution of heat that is generated during operation of the semiconductor device than might be achieved through the lead fingers alone. This heat sink effect may be enhanced by increasing the mass of one or more of the lead frame buses, as by enhancing their thickness within the constraints of the package dimensions, or by configuring the buses with one or more portions extending to the exterior of the package. While this latter approach may render the device more susceptible to external radio-frequency interference, such an arrangement may be shielded, if necessary, by techniques known in the art. Such variation is especially useful in embodiments of the present invention wherein the semiconductor device is enclosed in a plastic, ceramic, or other type of package.

Should the device to be fabricated comprise a leads-over-chip device, conventional polyimide or other dielectric film or tape strips may be adhered to one side of the lead fingers, and the semiconductor devices subsequently adhered to the film by their active surfaces as known in the art prior to electrical connection of the semiconductor device and lead frames.

Those of ordinary skill in the art will recognize and appreciate that the multi-layered lead frame according to the present invention may be employed for an enhancement to any conventional plastic package design having adequate depth between the planes in which the lead fingers are positioned and the exterior surface of the package.

Other advantages of the present invention will become apparent to those of ordinary skill in the relevant art through a consideration of the appended drawings and the ensuing description.

DETAILED DESCRIPTION OF THE INVENTION

Figure 1:
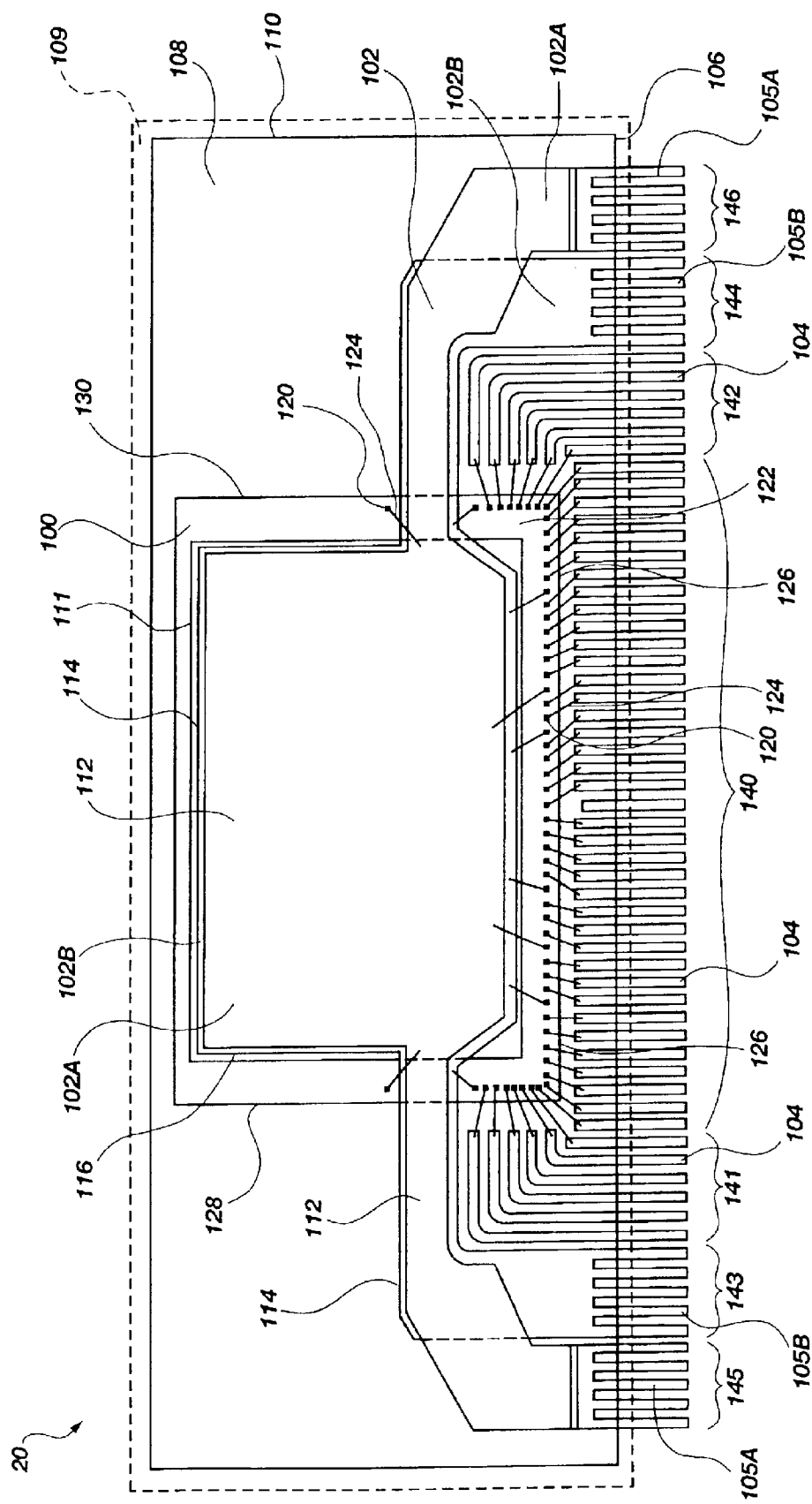
FIG. 1 is a top plan view of a vertical surface mount package- (VSMP-) configured semiconductor device and multi-layered lead frame assembly secured together such that the lead frame overlaps the active surface of the semiconductor device, and employing a decoupling capacitor according to the present invention.
Figure 2:
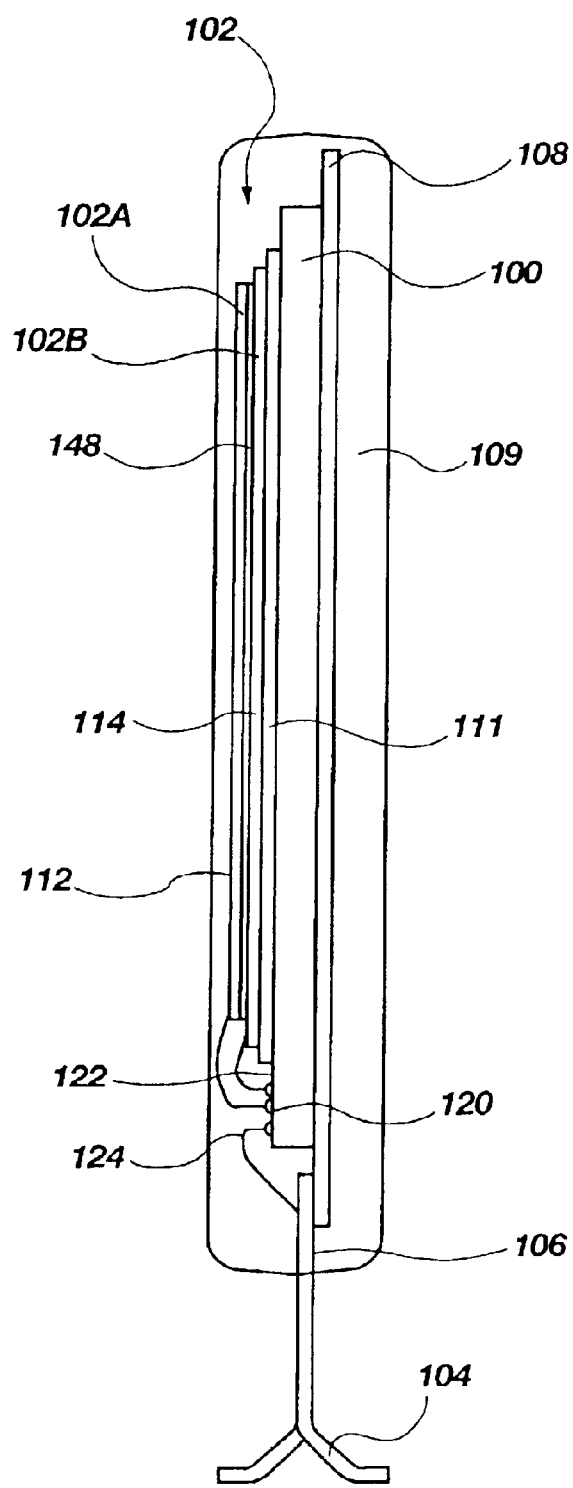
FIG. 2 is an enlarged side plan view of the assembly of FIG. 1.

With reference to FIGS. 1 and 2, a semiconductor device assembly 20 of the present invention is shown which includes a semiconductor device 100, also termed an integrated circuit die, that is mounted to a lead frame 102 and upon a substrate 108 in a vertical surface mount package (VSMP) configuration. An outline of the outer periphery of substrate 108 is shown at line 110. Lead frame 102 includes a plurality of lead fingers 104, 105A, 105B, each of which are configured to extend across the outer periphery of substrate 108 along a single side or edge 106 thereof for external connection.

Substrate 108 preferably comprises any suitable, well-known substrate material for use with a semiconductor device. Semiconductor device 100 may be secured to a major surface of substrate 108 by any suitable means, such as adhesive attachment.

As shown, lead frame 102 includes a first layer 102A and a second layer 102B and performs as a die attach paddle, to which the active surface 122 of semiconductor device 100 is secured. Lead frame 102 may be secured to substrate 108 so that first bus 112 overlaps semiconductor device 100 and so the lead frame is oriented relative to the semiconductor device in either a lead-over-chip (LOC) configuration or so the lead fingers 104, 105A, 105B thereof terminate proximate to the periphery of the semiconductor device, without overlapping the same. Alternatively, lead frame 102 may be secured to substrate 108, and the back side of semiconductor device 100 disposed over the lead frame, such as in a leads-under-chip configuration or otherwise. Lead fingers 104 may also be attached to substrate 108. The securing material 111, which secures semiconductor device 100 and/or lead frame 102 to substrate 108, is preferably a good thermal conductor to facilitate the distribution and dissipation of heat from semiconductor device 100 to lead frame 102 and/or substrate 108. Securing material 111 may comprise any suitable well-known type of electrically insulative film that may be adhesively coated to secure semiconductor device 100 and lead frame 102 to substrate 108, such as the polyimide film having adhesive on both surfaces thereof that is sold under the trade name KAPTON™ by E. I. du Pont de Nemours & Company of Wilmington, Del.

Returning to FIGS. 1 and 2, the first layer 102A of electrically conductive, wide first bus 112 that extends over a portion of the surface of semiconductor device 100 and a first plurality of lead fingers 105A, 105B that extend in substantially the same direction. Lead fingers 105A, 105B of first layer 102A extend from or are otherwise electrically connected with first bus 112.

Second layer 102B includes an electrically conductive, wide second bus 114 that also extends over a portion of the surface of semiconductor device 100 and a second plurality of lead fingers 104 that extend therefrom in substantially the same direction. Some of lead fingers 104 extend from or are otherwise electrically connected with second bus 114. First bus 112 and second bus 114 are oriented in such a manner that a substantial portion of the area of each of first bus 112 and second bus 114 overlap.

First bus 112 and second bus 114 each preferably comprise a low resistivity, high conductivity sheet of material such as copper or gold, although copper is preferred from a cost standpoint. An insulating element 148 (FIG. 2) is disposed between first layer 102A and second layer 102B to adhere the first and second lead frame layers together and to separate the overlapping portions of first bus 112 and second bus 114. Insulating element 148 is preferably manufactured from a dielectric or insulating material such as a polyimide film carrying adhesive on both surfaces thereof. An example of such a film is that sold under the trade name KAPTON™ by du Pont.

Figure 1A:
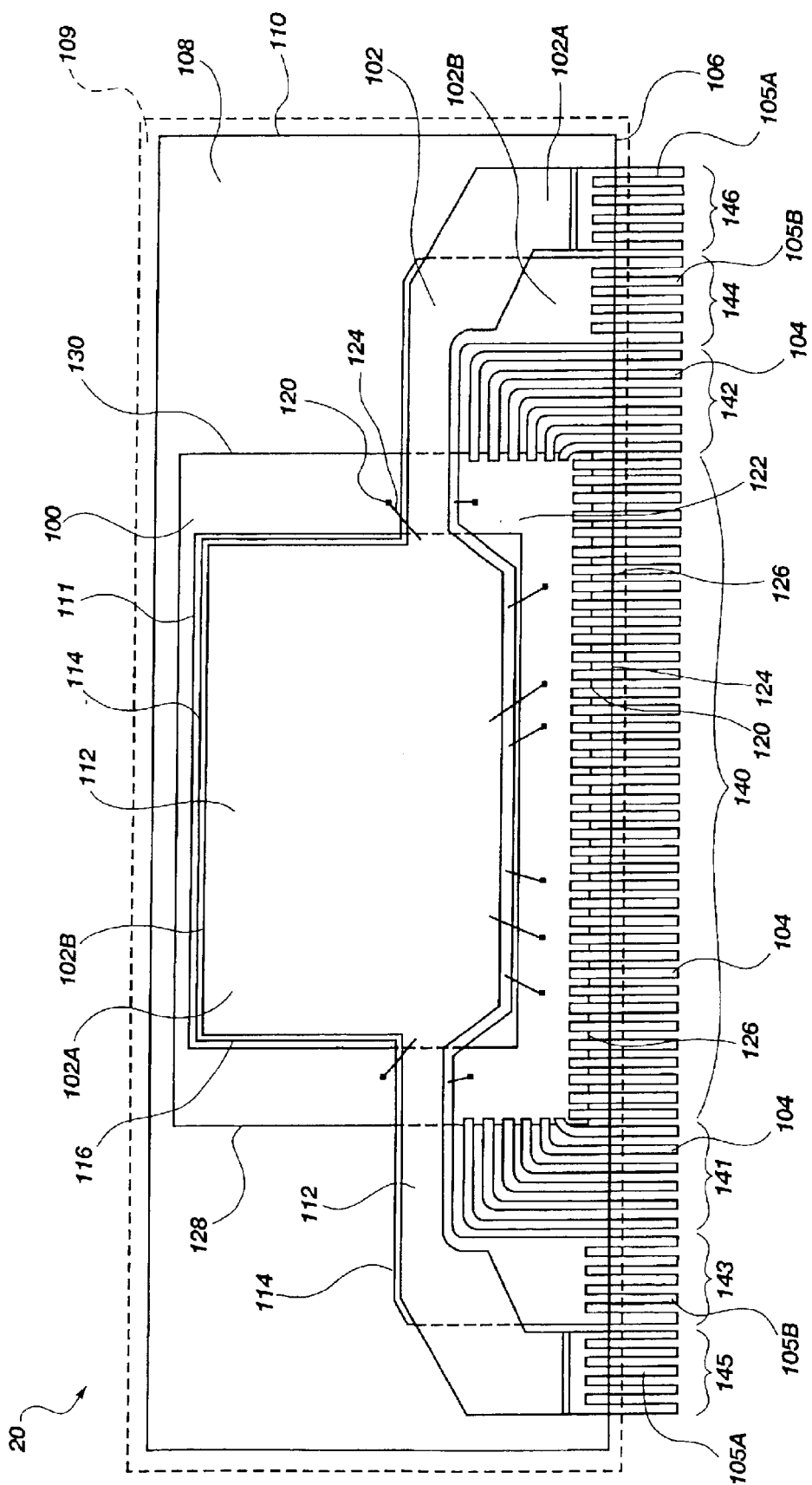
FIG. 1A is a schematic view of a variation of the VSMP-configured semiconductor device and multi-layered lead frame assembly shown in FIG. 1, wherein the leads of each lead frame layer extend partially over the active surface of the semiconductor die.

Bond wires 124 establish electrical connections between bond pads 120 on the active surface 122 of semiconductor device 100 and the lead fingers 104 of lead frame 102. Thus, bond wires 124 facilitate the passage of signals between the integrated circuitry that is carried on active surface 122 of semiconductor device 100 and external circuitry (not shown), such as conductive traces on a carrier substrate (e.g., a printed circuit board), and other conductors and active and passive components packaged in the same or a higher level. Alternatively, as depicted in FIG. 1A, device assemblies which employ direct thermocompression bonding of lead fingers 104A, 105B to bond pads 120, flex-circuit-type connections between lead fingers 104, 105A, 105B and bond pads 120 using conductors in a preformed pattern carried on a thin dielectric (typically termed tape automated bonding, or "TAB," connections), or other known apparatus and processes may be employed for establishing electrical connections with the bond pads of a semiconductor device.

A central group 140 of lead fingers 104 extends between a side 126 of semiconductor device 100 that lies closest to edge 106 of substrate 108. Each of the lead fingers 104 of central group 140 are extremely short, straight, mutually parallel, and of substantially uniform length. Adjacent each side of central group 140 are flanking groups 141 and 142 of discrete lead fingers 104. Each lead finger in flanking groups 141 and 142 extends between transverse sides 128 and 130 of semiconductor device 100 and edge 106 and have various lengths. Most of the lead fingers 104 of flanking groups 141 and 142 curve to form a 90-degree angle from their respective, substantially perpendicular orientation relative to transverse sides 128, 130 to an orientation that is substantially perpendicular to edge 106 as they exit the latter.

Flanking groups 141 and 142 are each flanked by a group of lead fingers 105B, which are electrically connected with and may be commonly connected to and extend from second bus 114, and are referred to as second bus extension groups 143 and 144, respectively. In turn, each of second bus extension groups 143 and 144 are flanked by another group of lead fingers 105A that are electrically connected with first bus 112, and are referred to as first bus extension groups 145 and 146, respectively. Lead fingers 105A may be commonly connected to first bus 112 and extend therefrom.

One of the first and second buses 112 or 114 is electrically connected to a ground ($V_{SS}$) through its respective groups of lead fingers 105 A, 105B while the other of the buses is electrically connected to a power supply source ($V_{CC}$), which is also referred to as a power source ($V_{CC}$), through its respective groups of lead fingers 105A, 105B. As depicted, first bus 112 of first layer 102A of lead frame 102 may be electrically connected to a power source ($V_{CC}$) by its corresponding lead fingers 105A (of first bus extension groups 145 and 146), and second bus 114 is electrically connected to a ground ($V_{SS}$) by its corresponding lead fingers 105B (of second bus extension groups 143 and 144). By commonly connecting lead fingers 105A to each other and lead fingers 105B to each other, as depicted, impedance is reduced, thereby facilitating the use of semiconductor devices 100 having high operating frequencies in semiconductor device assembly 20. Additionally, the depicted arrangement imparts lead fingers 105A and 105B with impedance that is similar to that of lead fingers 104.

The ground and power supply bond pads 120 on semiconductor device 100 are electrically connected (by bond wires 124) to the respective ground bus (second bus 114 in the embodiment illustrated in FIGS. 1 and 2) and power supply bus (first bus 112 in the embodiment illustrated in FIGS. 1 and 2). Preferably, the shape and orientation of the first and second buses 112 and 114 facilitate the use of very short bond wires 124 in order to reduce the conductor inductances between the decoupling capacitor and the bond pads 120 that are electrically connected therewith.

First bus 112 and second bus 114 act as capacitor plates and, in combination with insulating element 148, create a decoupling capacitor 116 that extends over a portion of the surface of semiconductor device 100. Alternatively, the orientation of $V_{CC}$ and $V_{SS}$ (i.e., of first bus 112 and second bus 114) relative to semiconductor device 100 may be reversed, as may the positioning of the first and second bus extension groups 145, 146 and 143, 144 relative to flanking groups 141 and 142.

Preferably, as illustrated in FIG. 1, the power supply ($V_{CC}$) lead fingers 105A (i.e., the lead fingers of groups 145 and 146) are separated from the lead fingers 104 of central group 140 and flanking groups 141 and 142 by grounded lead fingers 105B (i.e., the lead fingers of groups 143 and 144). This arrangement reduces the incidence of magnetic coupling or mutual inductance that may be caused by a power supply lead finger that is adjacent to another lead finger.

Decoupling capacitor 116 and the juxtaposition and grouping of power supply lead fingers 105A in first bus extension groups 145 and 146 (i.e., their isolation from the majority of lead fingers 104), as well as the juxtaposition and grouping of ground lead fingers 105B in second bus extension groups 143 and 144, alleviate the aforementioned detrimental effects of many packaged semiconductor devices in the prior art by lowering inductance, decoupling the power supply ($V_{CC}$) from the ground ($V_{SS}$), and thereby benefiting the electrical performance of the integrated circuitry carried by the associated semiconductor device 100 (e.g., by decreasing impedance, improving reflection, providing better signal integrity, etc.).

With continued reference to FIGS. 1 and 2, semiconductor device 100 preferably comprises a 64-megabit vertical surface mount package-configured, seventy (70) lead dynamic random access memory (DRAM), although the invention is not limited to the package configuration shown and described, or to a dynamic random access memory or other memory devices devices including, without limitation, static random access memories (SRAMs), synchronous dynamic random access memories (SDRAMs), sequential graphics random access memories (SGRAMs), electrically erasable programmable read-only memories (EEPROMs) and flash memories. The invention also has utility with regard to processors and application-specific integrated circuits (ASICs).

Figure 3:
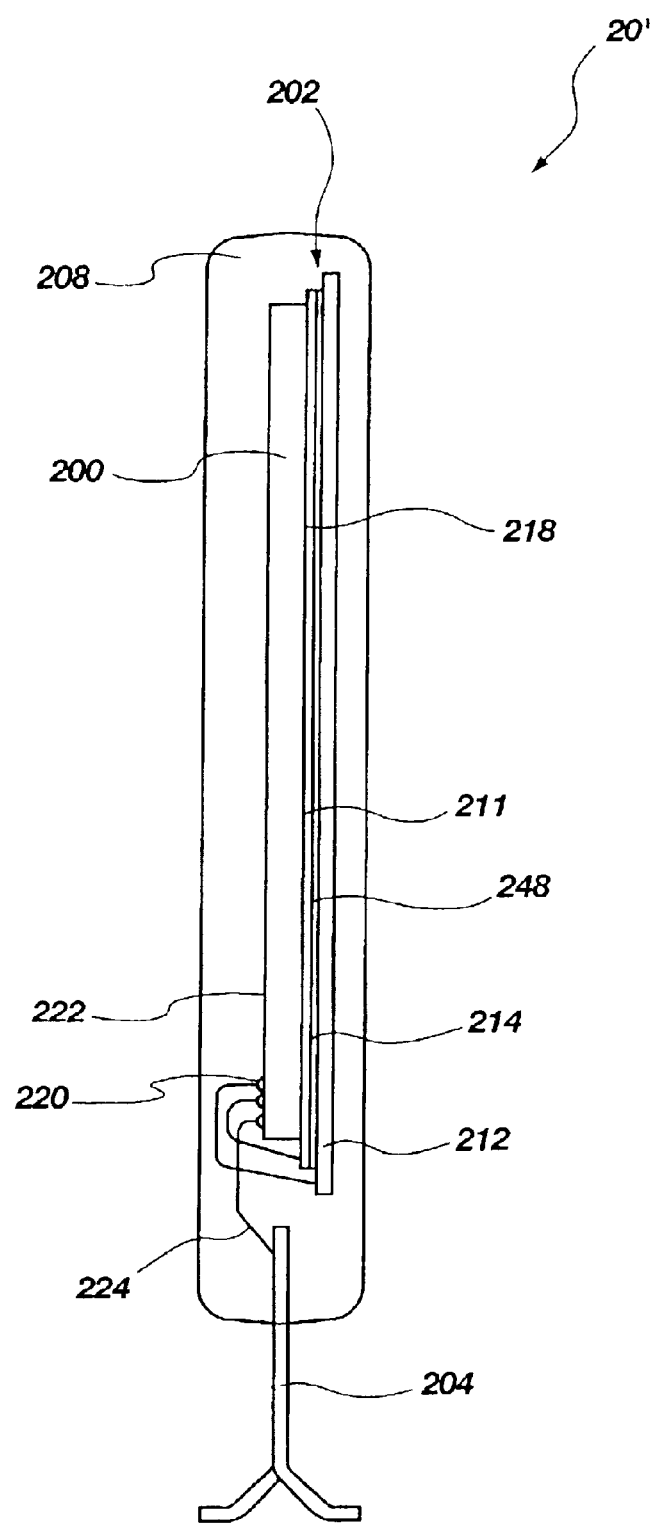
FIG. 3 is an enlarged side plan view illustrating a vertical surface mount package-configured semiconductor device and lead frame assembly secured together such that the lead frame overlaps the back side of the semiconductor device, and employing a decoupling capacitor according to the present invention.

Referring to FIG. 3, another embodiment of the semiconductor device assembly 20' according to the present invention is shown wherein the multi-layered lead frame 202, including a first bus 212 and a second bus 214, is attached to the base 218 of semiconductor device 200 with a securing material 211, such as that described above in reference to FIG. 1. First bus 212 and second bus 214 are separated by an insulating element 248, such as that described above in reference to FIG. 1, in order to form a decoupling capacitor. Lead fingers 204, which preferably extend substantially unidirectionally from semiconductor device assembly 20', are electrically connected with bond pads 220 on the active surface 222 of semiconductor device 200. This electrical connection may be established by bond wires 224, or as otherwise known in the art. A so-called "plastic" package 208, as known in the art, may be disposed over semiconductor device 200 and lead frame 202.

Figure 4:
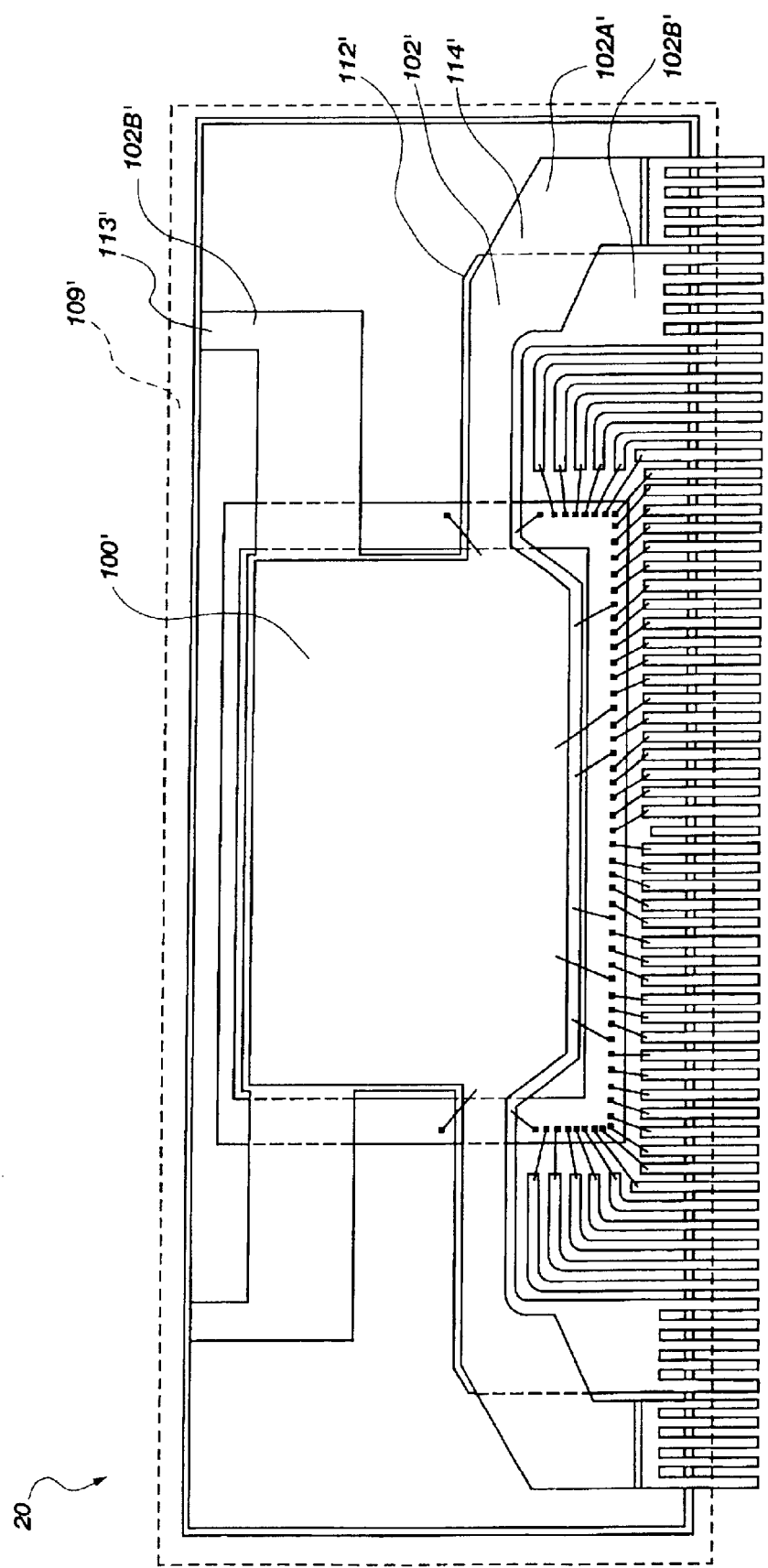
FIG. 4 is a top plan view of a packaged embodiment of the assembly of the present invention, depicting an alternative decoupling capacitor wherein at least one of the capacitor plates extends to the periphery of the package to provide enhanced heat transfer and distribution capabilities.

Turning now to FIG. 4, semiconductor device assembly 20 may also comprise a so-called "plastic" package 109' comprising a transfer-molded, filled polymer compound, as known in the art (FIGS. 1 and 2 also depict a package 109). However, alternative packaging such as preformed ceramic packages and potted encapsulants may also be used in the present invention.

If desired, or required by excessive heat output from a particular semiconductor device 100', lead frame 102', which include layers 102A' and 102B', may also include extensions 113' of either first bus 112', second bus 114', or both of them which extend to the outer periphery of the semiconductor device package in order to facilitate the dissipation of heat from the same. While extensions 113' may render the semiconductor device package more susceptible to external radio-frequency interference, such an arrangement may be shielded, if necessary, by techniques known in the art.

Figure 5:
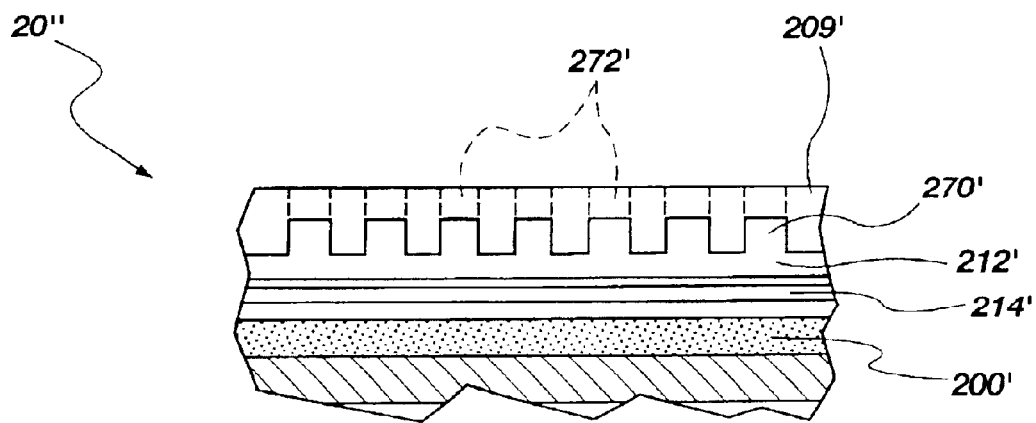
FIG. 5 is an enlarged side plan view of a portion of a leads-over-chip- (LOC-) configured semiconductor device and lead frame assembly as depicted in FIG. 4, but employing at least one capacitor plate modified to provide enhanced heat transfer and distribution capabilities.

Similarly, with reference to FIG. 5, in another embodiment of the semiconductor device assembly 20", if desired or required by excessive heat output from a particular semiconductor device 200', the outermost (relative to the semiconductor device) bus 212' may be configured with additional mass in the form of fins or other projections 270' opposite the underlying bus 214' and the semiconductor device. Projections 270' may extend to the exterior of package 209', which surrounds semiconductor device 200', as shown in broken lines 272'. Other mass increasing configurations are also possible and limited only by the available interior space of the package and the need to maintain the electrical performance of the packaged device. The approach of extending a portion of outermost bus 212' to the exterior of package 209' may render the semiconductor device package 20" susceptible to external radio-frequency interference. However, shielding techniques are known in the art, and may be employed if necessary with a package so configured.

The heat sinks depicted in FIGS. 4 and 5 may also be used in embodiments of the semiconductor device assembly that are not enclosed within a package.

Figure 6:
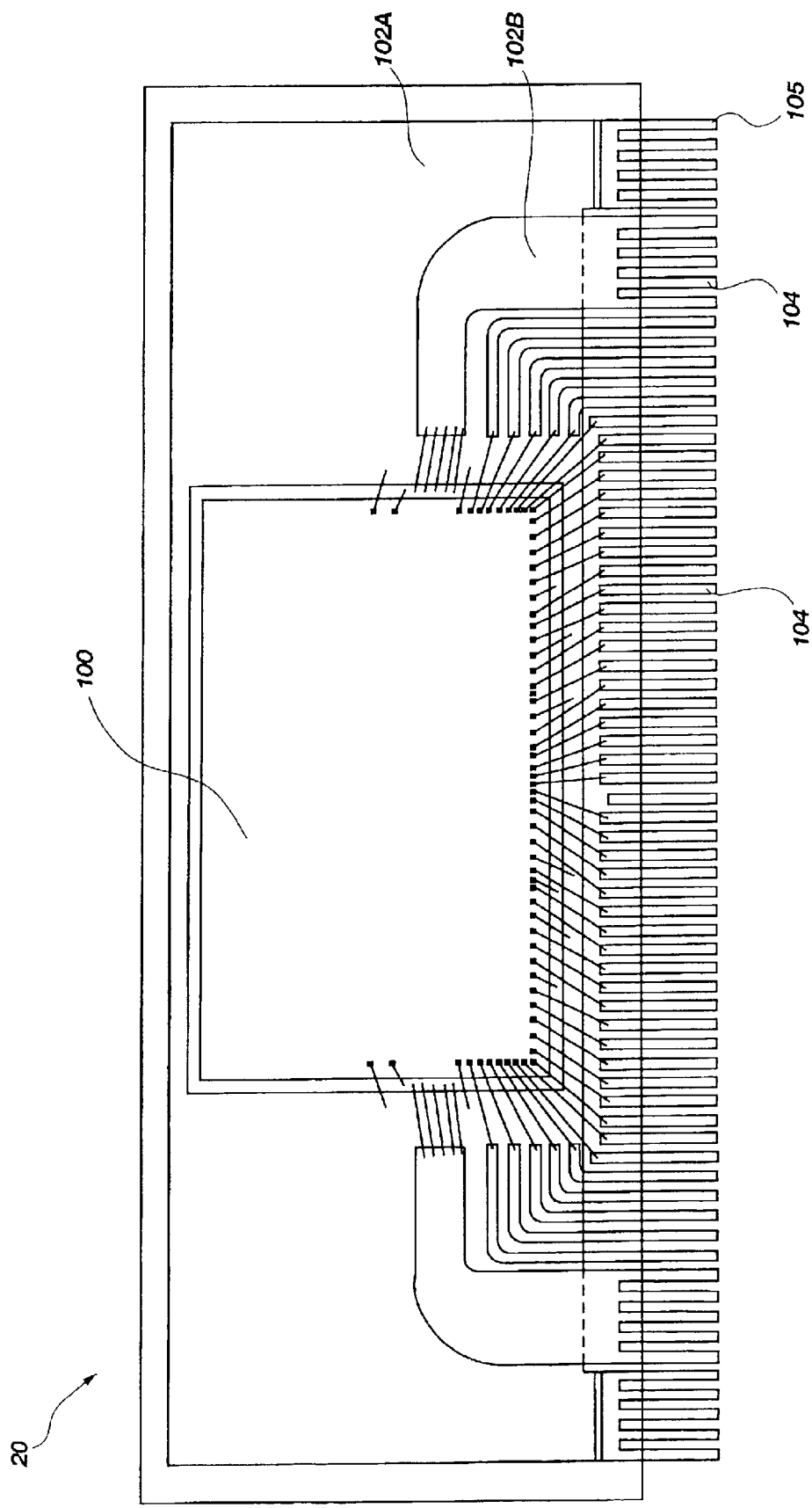
FIG. 6 is a top plan view of the assembly in FIG. 1, depicting alternatively shaped lead frame layers.

FIG. 6 illustrates a variation of the lead frame layers 102A and 102B of semiconductor device package 20, wherein the shape of the lead frame layers differs from that illustrated in FIGS. 1 and 4.

To maximize the benefit of the invention during implementation thereof, an attempt should be made to maximize the surface area of the decoupling capacitor. It may be preferable, if possible, to extend the buses laterally beyond the sides of the end lead fingers of a group, since the electrical field lines tend to be radial. It is also noteworthy that the decoupling capacitor of the invention also provides a modest improvement to electromagnetic interference (EMI) shielding. Finally, as those of ordinary skill in the art will appreciate, the beneficial effect of the invention also is dependent upon the distance between the capacitor plates (i.e., the buses), as well as the material chosen for the insulator element.

As a matter of practical and effective implementation of the present invention, there are several factors to be accommodated. First, if the buses are to be wire bonded to the semiconductor device bond pads, the buses should extend over the semiconductor device in a manner which permits the wire-bonding capillary to form a wire bond over the desired bond pads. Additionally, the transverse distance or space between the buses should be minimized, in order to maximize the beneficial effects of the invention. Finally, the surface areas of the coextensive portions of the buses should be maximized, but a sufficient portion of the periphery of the buses should be contained within the material of the package surrounding the semiconductor device and lead frame combination, with enough space or clearance between the edges of the buses and the exterior of the package so that package integrity and reliability is not affected.

Figure 7:
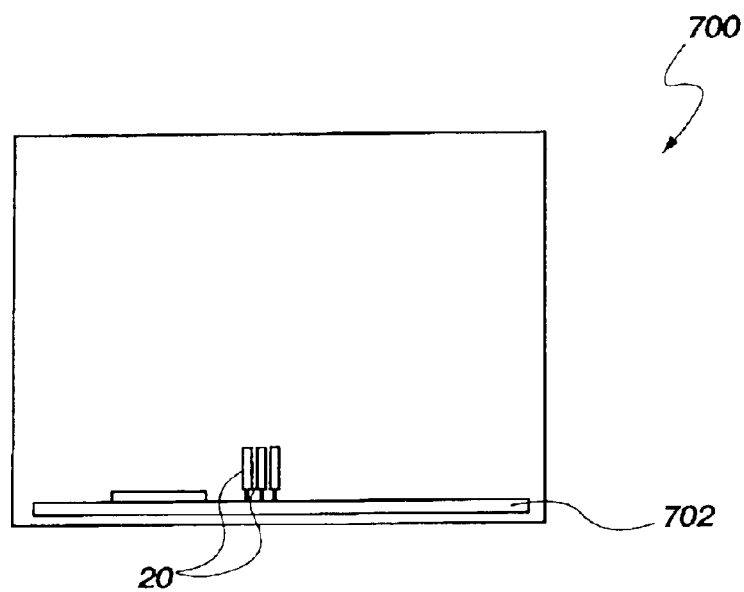
FIG. 7 is a schematic representation of the semiconductor device assembly according to the present invention associated with an electronic system.

FIG. 7 is a schematic representation of an electronic system 700, which includes a carrier substrate 702. A semiconductor device assembly 20 according to the present invention is in electrical communication with carrier substrate 702. Thus, semiconductor device assembly 20 is operatively associated with electronic system 700.

Although the foregoing description contains many specificities, these should not be construed as limiting the scope of the present invention, but merely as providing illustrations of some of the presently preferred embodiments. Similarly, other embodiments of the invention may be devised which do not depart from the spirit or scope of the present invention. The scope of this invention is, therefore, indicated and limited only by the appended claims and their legal equivalents, rather than by the foregoing description. All additions, deletions and modifications to the invention as disclosed herein which fall within the meaning and scope of the claims are to be embraced within their scope.

What is claimed is:

1. A semiconductor device assembly, comprising:
   a semiconductor die including a plurality of bond pads on an active surface thereof;
   a decoupling capacitor structure positioned over and in electrical isolation from the active surface and including:
      a first electrode comprising at least a portion of a first electrically conductive bus of a first lead frame layer; and
      a second electrode comprising at least a portion of a second electrically conductive bus of a second lead frame layer, the second bus being at least partially superimposed with respect to the first bus;
   a first group of leads of the first lead frame layer including a first plurality of leads electrically connected to corresponding bond pads of the plurality of bond pads; and
   a second group of leads of the second lead frame layer including a second plurality of leads connected to other corresponding bond pads of the plurality of bond pads.

2. The semiconductor device assembly of claim 1, wherein the first group of leads is located substantially centrally along an edge of the semiconductor device assembly and the second group of leads is located laterally adjacent to the first group of leads.

3. The semiconductor device assembly of claim 1, comprising two second groups of leads positioned on opposite sides of the first group of leads.

4. The semiconductor device assembly of claim 1, wherein the first and second lead frame layers form a lead frame.

5. The semiconductor device assembly of claim 1, wherein at least one of the first and second buses is electrically connected to a lead finger of the first and second groups.

6. The semiconductor device assembly of claim 1, further comprising a packaging material at least partially encapsulating the semiconductor die, the decoupling capacitor structure, and leads of the first and second groups.

7. A semiconductor device assembly, comprising:
   a semiconductor die including a plurality of bond pads on an active surface thereof;
   a lead frame positioned at least partially over the active surface, the lead frame including:
      a first lead frame layer comprising:
         a first plurality of leads in a first group, at least some leads of the first plurality electrically connected to corresponding bond pads of the plurality of bond pads; and
         a first bus at least partially superimposed with respect to the active surface; and
      a second lead frame layer comprising:
         a second plurality of leads in at least one second group, at least some leads of the second plurality of leads electrically connected to other corresponding bond pads of the plurality of bond pads; and
         a second bus at least partially superimposed with respect to the first bus;
   a first dielectric element between the lead frame and the active surface; and
   a second dielectric element between the first lead frame layer and the second lead frame layer, at least superimposed portions of the first lead frame layer, the second dielectric element, and the second lead frame layer forming a decoupling capacitor.

8. The semiconductor device assembly of claim 7, wherein the first group of leads extends from a single edge of the semiconductor device assembly.

9. The semiconductor device assembly of claim 8, wherein the at least one second group of leads also extends from the single edge.

10. The semiconductor device assembly of claim 9, wherein the at least one second group of leads is positioned laterally adjacent to the first group of leads.

11. The semiconductor device assembly of claim 10, comprising at least two second groups of leads positioned on opposite sides of the first group of leads.

12. The semiconductor device assembly of claim 7, further comprising a packaging material at least partially encapsulating the semiconductor die, the decoupling capacitor, and leads of the first group and the at least one second group.

13. A lead frame assembly, comprising:
   a first lead frame layer, including:
      a first bus; and
      a first group of leads oriented substantially parallel to one another;
   a second lead frame layer at least partially superimposed with respect to the first lead frame layer, the second lead frame layer including:

a second bus at least partially superimposed with respect to the first bus; and at least one second group of leads oriented substantially parallel to one another, the first and second lead frame layers mutually defining a common bottom edge of the lead frame assembly, the first and second groups of leads extending from the common bottom edge; and a dielectric element positioned at least partially between the first bus and the second bus.

14. The lead frame assembly of claim 13, wherein at least superimposed regions of the first bus, the dielectric element, and the second bus comprise a capacitor.

15. The lead frame assembly of claim 13, wherein leads of the first group and leads of the at least one second group are oriented substantially parallel to one another.

16. The lead frame assembly of claim 15, wherein the at least one second group is positioned laterally adjacent to the first group.

17. The lead frame assembly of claim 16, comprising at least two second groups of leads.

18. The lead frame assembly of claim 17, wherein the at least two second groups are positioned on opposite sides of the first group.

19. A decoupling capacitor, comprising:

a dielectric element configured to be positioned over at least a portion of an active surface of a semiconductor device;

a first electrode positioned on the dielectric element and comprising at least a portion of a bus of a first lead frame layer, the first lead frame layer also comprising a first group of leads in substantially mutually parallel orientation;

another dielectric element superimposed with respect to at least a portion of the bus; and a second electrode on an opposite side of the another dielectric element from the first electrode and superimposed with respect to the first electrode, the second electrode comprising at least a portion of a bus of a second lead frame layer, the second lead frame layer also comprising at least one second group of leads in substantially mutually parallel orientation.

20. The decoupling capacitor of claim 19, wherein the leads of both the first group and the at least one second group are oriented substantially parallel to one another.

21. The decoupling capacitor of claim 20, wherein the at least one second group is positioned laterally adjacent to the first group.

22. The decoupling capacitor of claim 21, comprising at least two second groups of leads positioned on opposite sides of the first group.

* * * * *

UNITED STATES PATENT AND TRADEMARK OFFICE
CERTIFICATE OF CORRECTION

PATENT NO. : 7,071,542 B2
APPLICATION NO. : 10/269191
DATED : July 4, 2006
INVENTOR(S) : David J. Corisis and Chris G. Martin It is certified that error appears in the above-identified patent and that said Letters Patent is hereby corrected as shown below:

On the title page section (56):
References Cited
OTHER DOCUMENTS                insert --Hyperquad Series Type 5, Three Metal Layer QFP (TM QFP), 2 pages--
                               insert --English translation of Japanese Patent No. 4188759.--

In the drawings:
In FIG. 6                      change the right occurrence of "104" to --105B-- and change reference numeral "105" to --105A--

In the specification:
COLUMN 5, LINES 56-57,         change "the first layer 102A of electrically conductive, wide first bus 112" to --the first layer 102A of lead frame 102 includes an electrically conductive, wide first bus 112--
COLUMN 5, LINE 59,             change "105A, 105B" to --105A and, optionally, lead fingers 104--
COLUMN 5, LINE 60,             change "105A, 105B" to --105A, 104--
COLUMN 5, LINE 66,             after "lead fingers" and before "104" insert --105B and, optionally, leadfingers--
COLUMN 5, LINE 67,             after "lead fingers" and before "104" insert --105B--
COLUMN 6, LINE 28,             change "lead fingers 104A, 105B" to --lead fingers 104, 105A, 105B--
COLUMN 7, LINE 60,             change "memory devices devices including," to --memory devices including,--

UNITED STATES PATENT AND TRADEMARK OFFICE
CERTIFICATE OF CORRECTION

PATENT NO. : 7,071,542 B2
APPLICATION NO. : 10/269191
DATED : July 4, 2006
INVENTOR(S) : David J. Corisis and Chris G. Martin It is certified that error appears in the above-identified patent and that said Letters Patent is hereby corrected as shown below:

In the claims:
CLAIM 19, COLUMN 11, LINE 28, change "device:" to --device;--

Signed and Sealed this

Twenty-second Day of January, 2008

JON W. DUDAS
*Director of the United States Patent and Trademark Office*

UNITED STATES PATENT AND TRADEMARK OFFICE
CERTIFICATE OF CORRECTION

PATENT NO. : 7,071,542 B2
APPLICATION NO. : 10/269191
DATED : July 4, 2006
INVENTOR(S) : David J. Corisis and Chris G. Martin It is certified that error appears in the above-identified patent and that said Letters Patent is hereby corrected as shown below:

Replace FIG. 6 with the following amended figure:

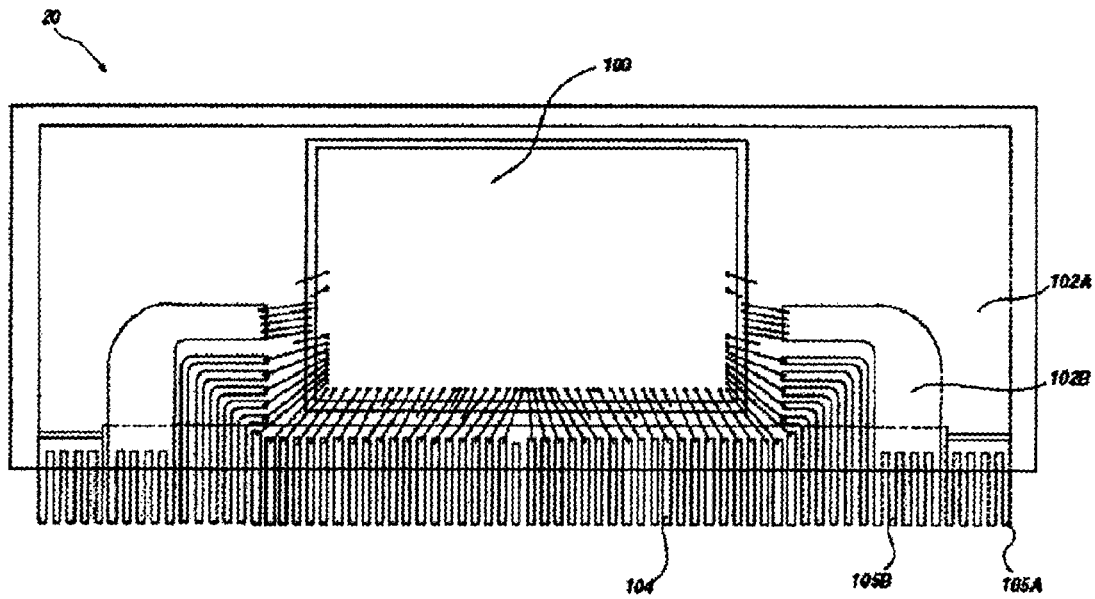

Fig. 6